United States Patent
Ding et al.

(10) Patent No.: US 7,538,383 B1
(45) Date of Patent: May 26, 2009

(54) TWO-BIT MEMORY CELL HAVING CONDUCTIVE CHARGE STORAGE SEGMENTS AND METHOD FOR FABRICATING SAME

(75) Inventors: Meng Ding, Sunnyvale, CA (US); Simon S. Chan, Saratoga, CA (US)

(73) Assignee: Spansion LLC, Sunnyvale, CA (US)

( * ) Notice: Subject to any disclaimer, the term of this patent is extended or adjusted under 35 U.S.C. 154(b) by 379 days.

(21) Appl. No.: 11/416,703

(22) Filed: May 3, 2006

(51) Int. Cl.
*H01L 29/792* (2006.01)
(52) U.S. Cl. .................. 257/323; 257/213; 257/315; 257/E21.18; 257/E21.679
(58) Field of Classification Search .............. 257/ E21.645–E21.694
See application file for complete search history.

(56) References Cited

U.S. PATENT DOCUMENTS 7,276,760 B2 * 10/2007 Bhattacharyya ............. 257/321
2006/0170029 A1 * 8/2006 Liu et al. ................... 257/315
2007/0242515 A1 * 10/2007 Aritome ................. 365/185.17

* cited by examiner

*Primary Examiner*—N Drew Richards
*Assistant Examiner*—Mamadou Diallo
(74) *Attorney, Agent, or Firm*—Farjami & Farjami LLP

(57) ABSTRACT

According to one exemplary embodiment, a two-bit memory cell includes a gate stack situated over a substrate, where the gate stack includes a charge-trapping layer. The charge-trapping layer includes first and second conductive segments and a nitride segment, where the nitride segment is situated between the first and second conductive segments. The nitride segment electrically insulates the first conductive segment from the second conductive segment. The first and second conductive segments provide respective first and second data bit storage locations in the two-bit memory cell. The gate stack can further include a lower oxide segment situated between the substrate and the charge-trapping layer. The gate stack can further include an upper oxide segment situated over the charge-trapping layer. The gate stack can be situated between a first dielectric segment and a second dielectric segment, where the first and second dielectric segments are situated over respective first and second bitlines.

10 Claims, 7 Drawing Sheets

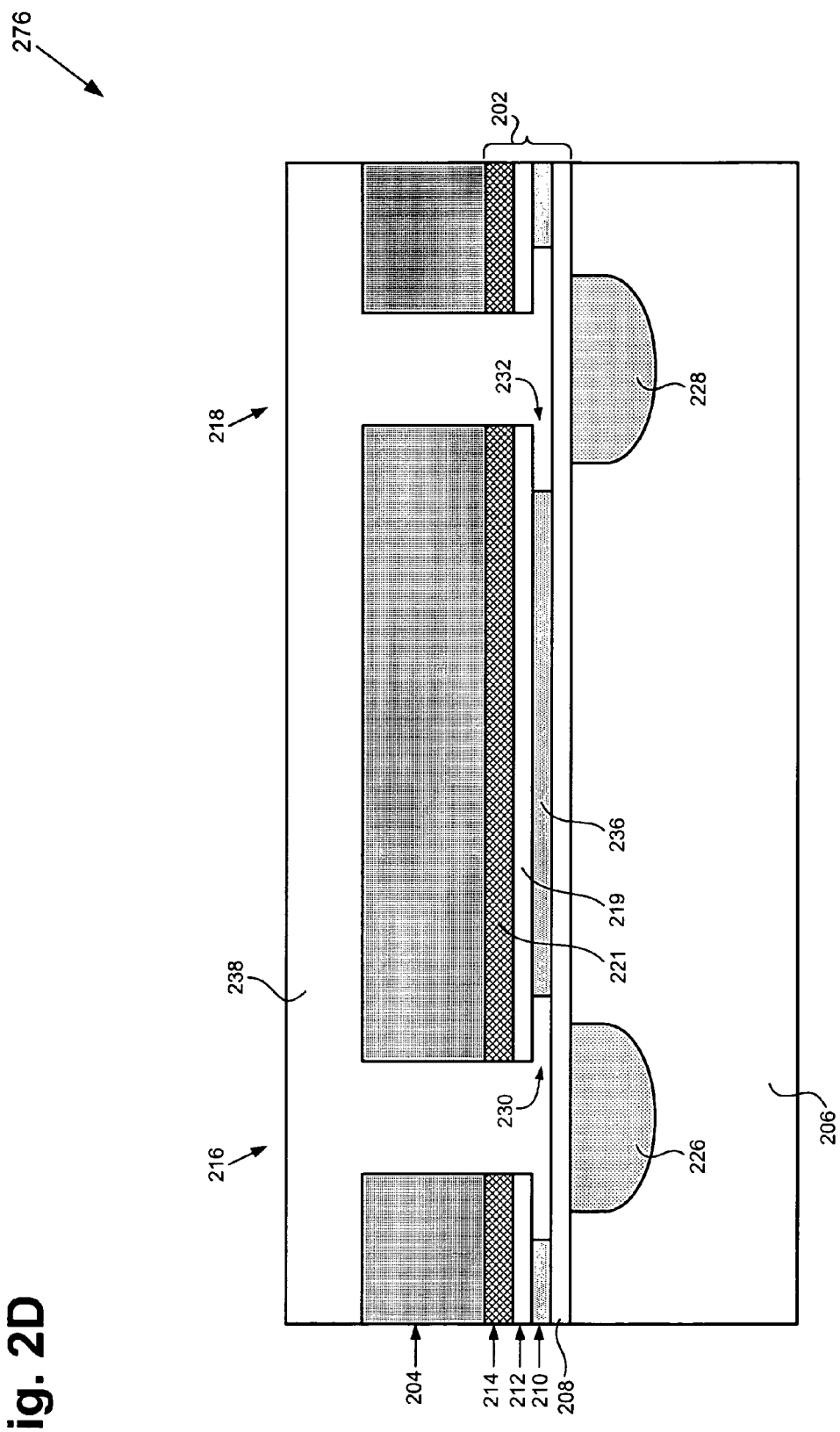

TWO-BIT MEMORY CELL HAVING CONDUCTIVE CHARGE STORAGE SEGMENTS AND METHOD FOR FABRICATING SAME

TECHNICAL FIELD

The present invention is generally in the field of fabrication of semiconductor devices. More specifically, the present invention is in the field of fabrication of memory cells in semiconductor devices.

BACKGROUND ART

Memory cells capable of storing two independent bits in separate locations within the memory cell, such as Advanced Micro Devices' (AMD) MirrorBit™ memory cells, can be utilized to achieve high-density non-volatile memory devices, such as high-density flash memory devices. In a conventional two-bit memory cell, a right and a left bit can be stored in respective storage locations in a layer of silicon nitride. The two-bit memory cell can be programmed by utilizing hot electron injection and erased by utilizing either a hot hole injection or Fowler-Nordheim tunneling. However, the Fowler-Nordheim tunneling erase process is the preferred method of erasing the two-bit memory cell because it is fast, consumes less power, and is suitable for mass storage applications.

However, in a conventional two-bit memory cell, charge storage is localized in the layer of silicon nitride, which has low electron mobility. The low electron mobility, which is due, in part, to low trap density in silicon nitride, prevents electrons from easily moving in the silicon nitride layer. As a result, the erase process is undesirably slow when the Fowler-Nordheim tunneling erase process is utilized to erase the conventional two-bit memory cell.

Thus, there is a need in the art for a two-bit memory cell having an increased erase speed.

SUMMARY

The present invention is directed to a two-bit memory cell having conductive charge storage segments and method for fabricating same. The present invention addresses and resolves the need in the art for a two-bit memory cell having an increased erase speed.

According to one exemplary embodiment, a two-bit memory cell includes a gate stack situated over a substrate, where the gate stack includes a charge-trapping layer. For example, the two-bit memory cell can be a two-bit flash memory cell. The charge-trapping layer includes first and second conductive segments and a nitride segment, where the nitride segment is situated between the first and second conductive segments. The first and second conductive segments can be silicon-rich nitride or polycrystalline silicon, for example. The nitride segment electrically insulates the first conductive segment from the second conductive segment. The first and second conductive segments provide respective first and second data bit storage locations in the two-bit memory cell.

According to this embodiment, the two-bit memory cell further includes a control gate situated over the gate stack, where the control gate can be polycrystalline silicon. The gate stack can further include a lower oxide segment situated between the substrate and the charge-trapping layer. The gate stack can further include an upper oxide segment situated over the charge-trapping layer. The gate stack can further include a gate injection blocking segment situated over the upper oxide segment, where the gate injection blocking segment can be a high-k dielectric material. The gate stack can be situated between a first dielectric segment and a second dielectric segment, where the first dielectric segment is situated over a first bitline and the second dielectric segment is situated over a second bitline. According to one embodiment, the invention is a method for fabricating the above-described two-bit memory cell. Other features and advantages of the present invention will become more readily apparent to those of ordinary skill in the art after reviewing the following detailed description and accompanying drawings.

BRIEF DESCRIPTION OF THE DRAWINGS

FIG. 2D illustrates a cross-sectional view, which includes a portion of a wafer processed according to an embodiment of the invention, corresponding to an intermediate step in the flowchart in FIG. 1.

DETAILED DESCRIPTION OF THE INVENTION

Figure 1:
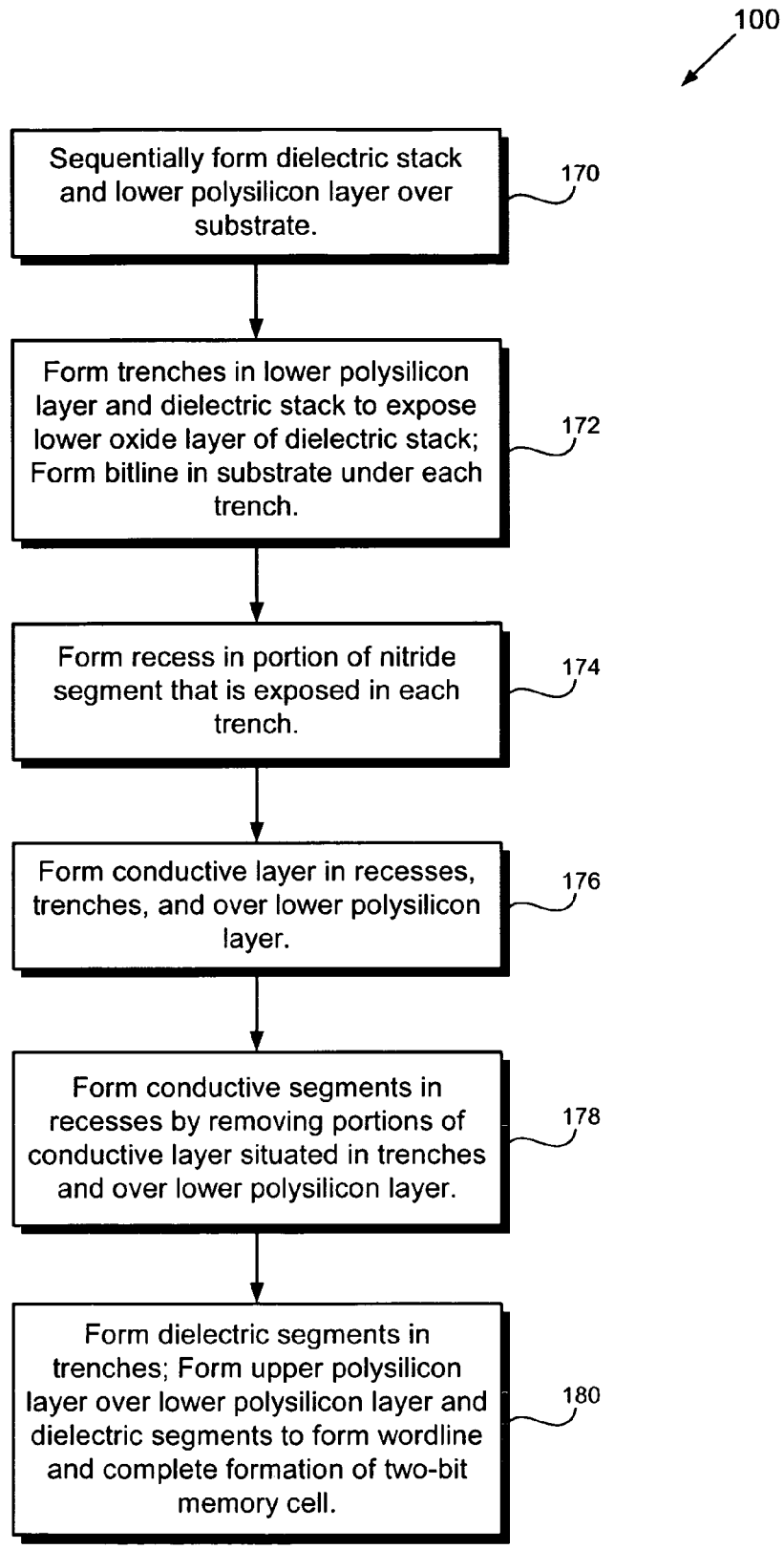
FIG. 1 shows a flowchart illustrating the steps taken to implement an embodiment of the present invention.

The present invention is directed to a two-bit memory cell having conductive charge storage segments and method for fabricating same. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings. It should be borne in mind that, unless noted otherwise, like or corresponding elements among the figures may be indicated by like or corresponding reference numerals.

FIG. 1 shows a flowchart illustrating an exemplary method according to an embodiment of the present invention. Certain details and features have been left out of flowchart 100 that are apparent to a person of ordinary skill in the art. For example, a step may consist of one or more substeps or may involve specialized equipment or materials, as known in the art. Steps 170 through 180 indicated in flowchart 100 are sufficient to describe one embodiment of the present invention; other embodiments of the invention may utilize steps different from those shown in flowchart 100.

Moreover, structures 270 through 280 in FIGS. 2A through 2F illustrate the result of performing steps 170 through 180 of flowchart 100, respectively. For example, structure 270 shows a semiconductor structure after processing step 170, structure 272 shows structure 270 after the processing of step 172, structure 274 shows structure 272 after the processing of step 174, and so forth. It is noted that although formation of only one two-bit memory cell is specifically discussed herein to preserve brevity, multiple two-bit memory cells may be formed on a substrate by utilizing the innovative process of the present invention.

Figure 2A:
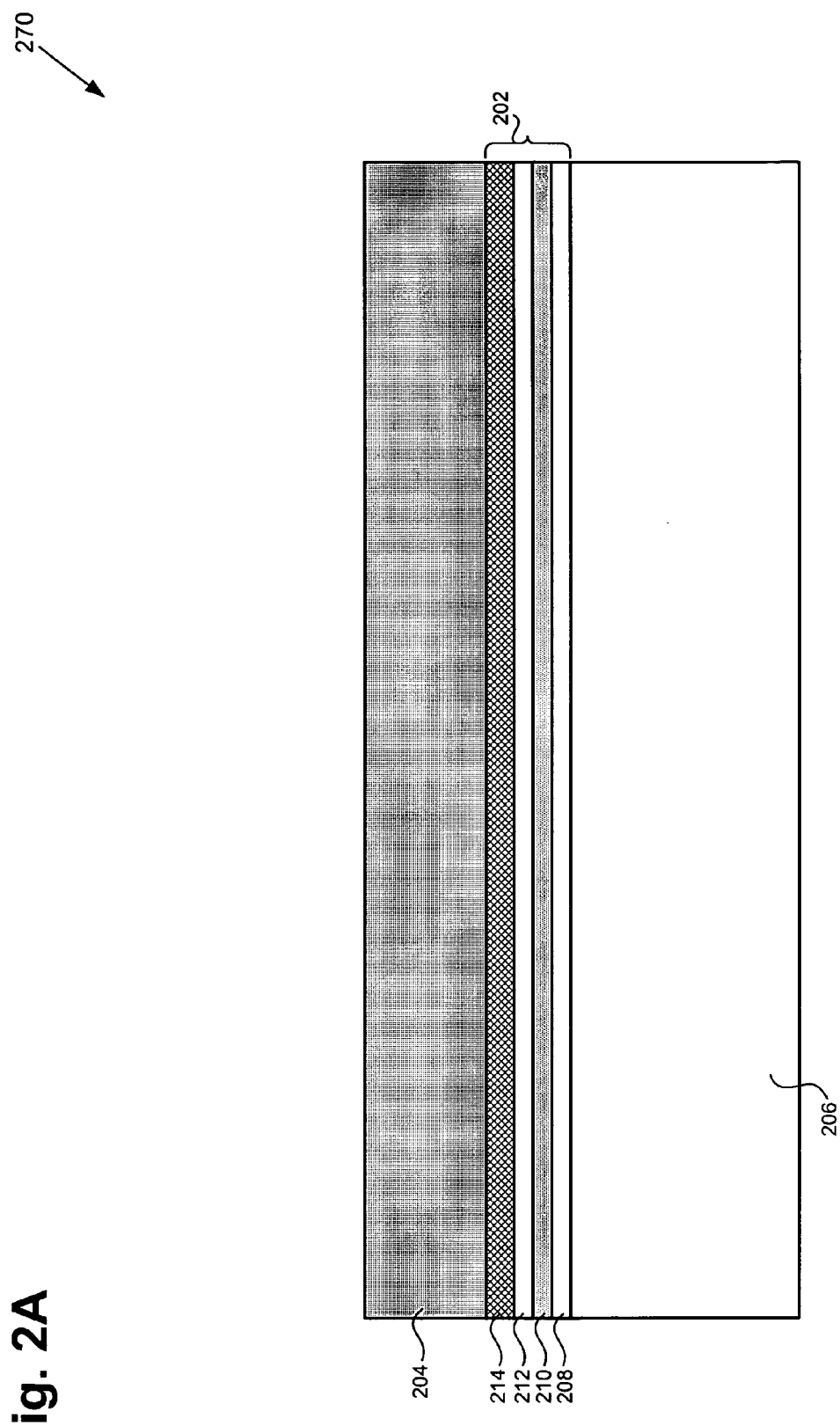
FIG. 2A illustrates a cross-sectional view, which includes a portion of a wafer processed according to an embodiment of the invention, corresponding to an initial step in the flowchart in FIG. 1.

Referring now to step 170 in FIG. 1 and structure 270 in FIG. 2A, at step 170 of flowchart 100, dielectric stack 202 and lower polysilicon layer 204 are sequentially formed over substrate 206. Structure 270 can be a memory array, such as a flash memory array, in an intermediate fabrication stage. Dielectric stack 202 comprises lower oxide layer 208, nitride layer 210, upper oxide layer 212, and gate injection blocking layer 214. In dielectric stack 202, lower oxide layer 208, nitride layer 210, and upper oxide layer 212 form an Oxide-Nitride-Oxide (ONO) stack. In other embodiments, dielectric stack 202 can include a different combination of dielectric layers.

As shown in FIG. 2A, lower oxide layer 208 is situated over substrate 206 and can comprise silicon oxide. Lower oxide layer 208 can be formed, for example, by thermally growing a layer of silicon oxide ($SiO_2$) on substrate 206. Also shown in FIG. 2A, nitride layer 210 is situated over lower oxide layer 208 and can comprise silicon nitride ($Si_3N_4$), which is a dielectric material. Lower oxide layer 208 can have a thickness of between 40.0 Angstroms and 70.0 Angstroms, for example. Nitride layer 210 can be formed by depositing a layer of silicon nitride over lower oxide layer 208 by using a CVD process or other suitable deposition processes. Nitride layer 210 can have a thickness of between 50.0 Angstroms and 80.0 Angstroms, for example.

Further shown in FIG. 2A, upper oxide layer 212 is situated over nitride layer 210 and can comprise silicon oxide ($SiO_2$). Upper oxide layer 212 can be formed by depositing a layer of silicon oxide over nitride layer 210 by using a CVD process or other suitable deposition processes. Upper oxide layer 212 can have a thickness of between 50.0 Angstroms and 100.0 Angstroms, for example. Also shown in FIG. 2A, gate injection blocking layer 214 is situated over upper oxide layer 212 and can comprise a high dielectric constant (high-k) dielectric material, such as aluminum oxide ($Al_2O_3$) or hafnium oxide ($HfO_2$), for example. Gate injection blocking layer 214 can be formed by depositing a layer of high-k dielectric material over upper oxide layer 212 by using a CVD process or other suitable deposition processes. For example, gate injection blocking layer 214 can have a thickness of between 100.0 Angstroms and 150.0 Angstroms.

Further shown in FIG. 2A, lower polysilicon layer 204 is situated over gate injection blocking layer 214 and can comprise polycrystalline silicon (polysilicon). Lower polysilicon layer 204 can be formed by depositing a layer of polysilicon over gate injection blocking layer 214 (i.e. over dielectric stack 202) by using a CVD process or other suitable deposition processes. Lower polysilicon layer 204 can have a thickness of between 800.0 Angstroms and 1200.0 Angstroms, for example. The result of step 170 of flowchart 100 is illustrated by structure 270 in FIG. 2A.

Figure 2B:
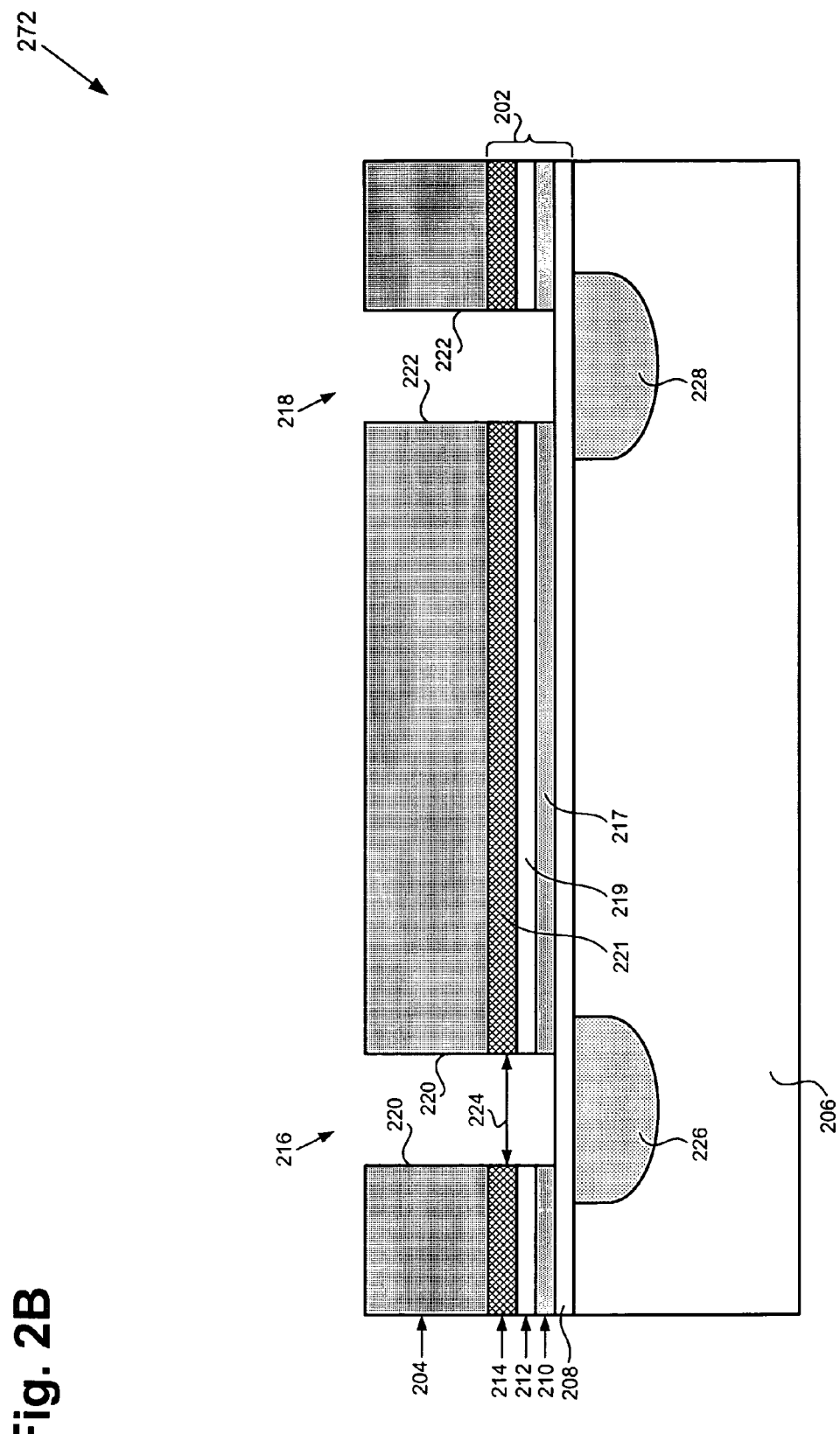
FIG. 2B illustrates a cross-sectional view, which includes a portion of a wafer processed according to an embodiment of the invention, corresponding to an intermediate step in the flowchart in FIG. 1.

Referring to step 172 in FIG. 1 and structure 272 in FIG. 2B, at step 172 of flowchart 100, trenches 216 and 218 are formed in lower polysilicon layer 204 and dielectric stack 202 so as to expose lower oxide layer 208 of dielectric stack 202. Trenches 216 and 218 are situated over and exposed lower oxide layer 208 of dielectric stack 202. Trenches 216 and 218 have respective sidewalls 220 and 222. Trenches 216 and 218 have width 224, which can be between 700.0 Angstroms and 1200.0 Angstroms, for example. Trenches 216 and 218 can be formed, for example, by etching openings in lower polysilicon layer 204 and extending the openings by etching through gate injection blocking layer 214, upper oxide layer 212, and nitride layer 210 to expose lower oxide layer 210 of dielectric stack 202. The openings can be etched through lower polysilicon layer 204, upper oxide layer 212, and nitride layer 210 by using a dry etch process, such as a plasma etch process. Gate injection blocking segment 221, upper oxide segment 219, and nitride segment 217 comprise respective segments of gate injection blocking layer 214, upper oxide layer 212, and nitride layer 210 situated between trenches 216 and 218.

Also at step 172 of flowchart 100, bitlines 226 and 228 are formed in substrate 206 under respective trenches 216 and 218. Bitlines 226 and 228 are situated in substrate 206 under lower oxide layer 208 and under respective trenches 216 and 218 and can comprise an appropriate dopant, such as an appropriate N type dopant. Bitlines 226 and 228 can be formed by implanting an appropriate dopant through segments of lower oxide layer 208 that are exposed in respective trenches 216 and 228 and into portions of substrate 206 situated under trenches 216 and 218. An appropriate heating process can be performed to diffusion the implanted dopant in substrate 206. The result of step 172 of flowchart 100 is illustrated by structure 272 in FIG. 2B.

Figure 2C:
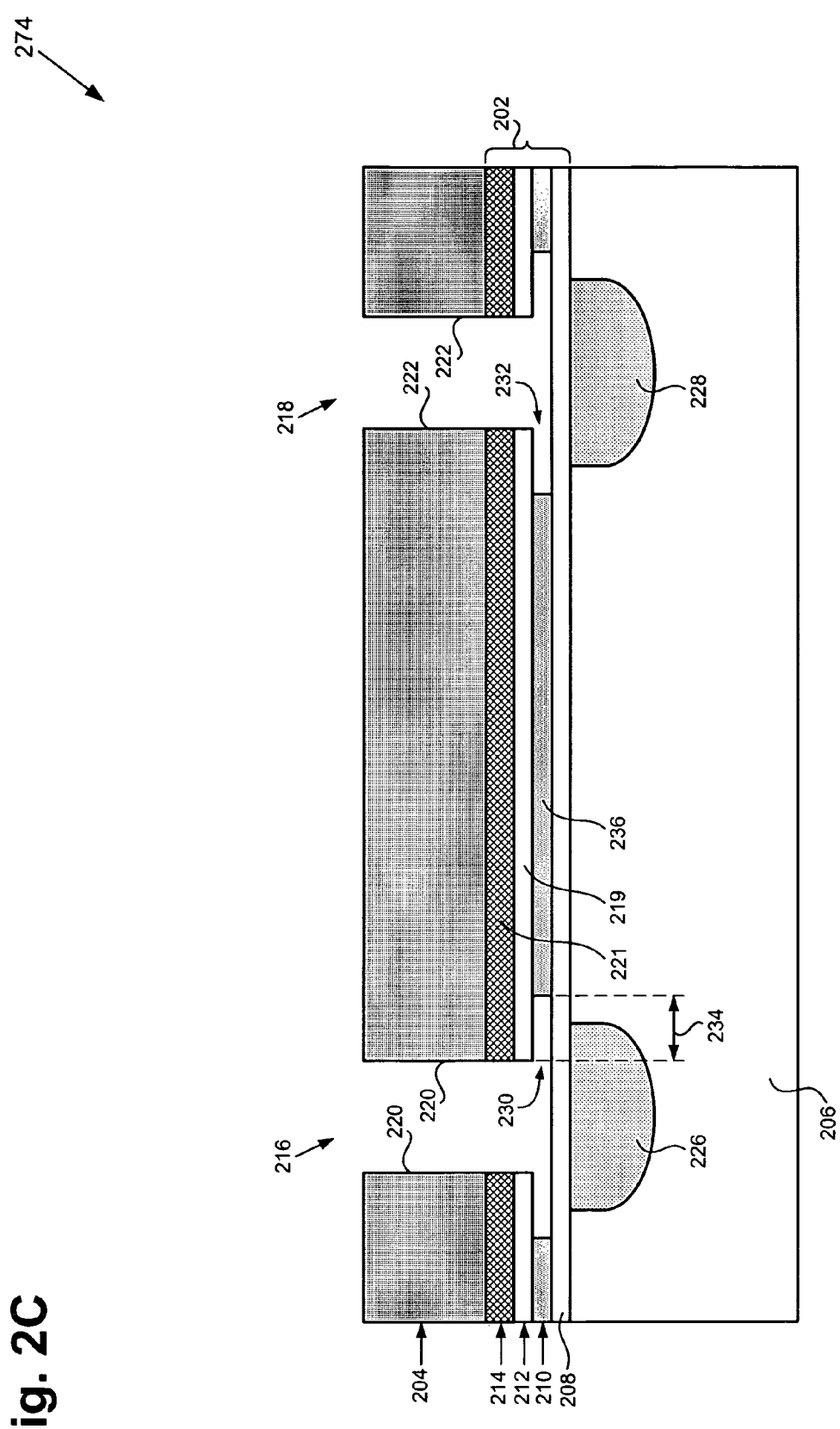
FIG. 2C illustrates a cross-sectional view, which includes a portion of a wafer processed according to an embodiment of the invention, corresponding to an intermediate step in the flowchart in FIG. 1.

Referring to step 174 in FIG. 1 and structure 274 in FIG. 2C, at step 174 of flowchart 100, recesses 230 and 232 are formed in portion of nitride segment 217 (shown in FIG. 2B) that is exposed in respective trenches 216 and 218. Recesses 230 and 232 are situated adjacent to respective sidewalls 220 and 222 of trenches 216 and 218 and also situated between upper oxide segment 219 and lower oxide layer 208 of dielectric stack 202. Recesses 230 and 232 have depth 234, which can be between 100.0 Angstroms and 200.0 Angstroms. Recesses 230 and 232 can be formed by using an isotropic etch process, such as a wet etch process, to remove an appropriate amount of nitride segment 217 (shown in FIG. 2B), which is exposed on respective sidewalls 220 and 222 of trenches 216 and 218. Recesses 230 and 232 are separated by nitride segment 236, which is the portion of nitride segment 217 (shown in FIG. 2B) that remains after formation of recesses 230 and 232. It is also noted that although only recesses 230 and 232 are described in detail herein to preserve brevity, two recesses can be formed in each trench, such as trench 216, that is formed in structure 274. The result of step 174 of flowchart 100 is illustrated by structure 274 in FIG. 2C.

Referring to step 176 in FIG. 1 and structure 276 in FIG. 2D, at step 176 of flowchart 100, Conductive layer 238 is formed in recesses 230 and 232, trenches 216 and 218, and over lower polysilicon layer 204. Conductive layer 238 is situated in recesses 230 and 232, trenches 216 and 218, and over lower polysilicon layer 204 and can comprise silicon-rich nitride, polysilicon, or other appropriate conductive material. Conductive layer 238 can be formed, for example, by using a CVD process or other suitable processes to conformally deposit a layer of conductive material, such as silicon-rich nitride or polysilicon, in trenches 216 and 218 and over lower polysilicon layer 204 so as to fill recesses 230 and 232 with the conductive material. The result of step 176 of flowchart 100 is illustrated by structure 276 in FIG. 2D.

Figure 2E:
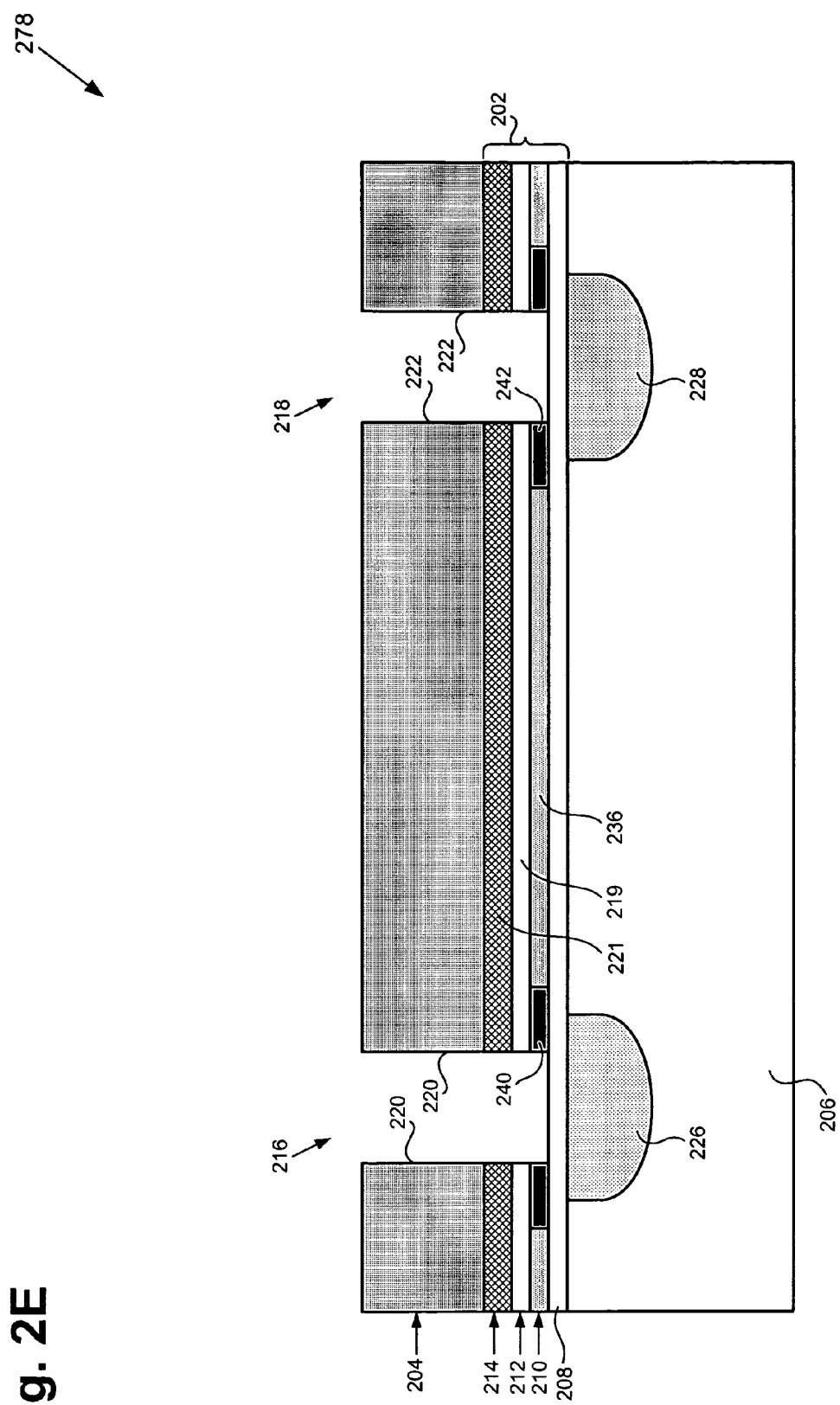
FIG. 2E illustrates a cross-sectional view, which includes a portion of a wafer processed according to an embodiment of the invention, corresponding to an intermediate step in the flowchart in FIG. 1.

Referring to step 178 in FIG. 1 and structure 278 in FIG. 2E, at step 178 of flowchart 100, conductive segments 240 and 242 are formed in respective recesses 230 and 232 (shown in FIGS. 2C and 2D) by removing portions of conductive layer 238 (shown in FIG. 2D) situated in trenches 216 and 218 and situated over lower polysilicon layer 204. Conductive segments 240 and 242 are situated adjacent to respective sidewalls 220 and 222 of trenches 216 and 218. Conductive segments 240 and 242 are also situated between lower oxide layer 208 and upper oxide segment 219 of dielectric stack 202 and can comprise silicon-rich nitride, polysilicon, or other suitable conductive material. Conductive segments 240 and 242 can have a length of between 100.0 Angstroms and 200.0 Angstroms, which is substantially equal to depth 234 (shown in FIG. 2C) of recesses 230 and 232.

Conductive segments 240 and 242 can be utilized as independent storage locations for respective data bits in a two-bit memory cell that is being formed over substrate 206 and between bitlines 226 and 228. Conductive segments 240 and 242 can be formed by using a suitable dry etch process, such as a plasma etch process, to etch back portions of conductive layer 238 (shown in FIG. 2D) situated in respective trenches 216 and 218. It is also noted that although only conductive segments 240 and 242 are described in detail herein to preserve brevity, conductive segments are formed in each trench, such as trench 216, that is situated in structure 278. The result of step 178 of flowchart 100 is illustrated by structure 278 in FIG. 2E.

Figure 2F:
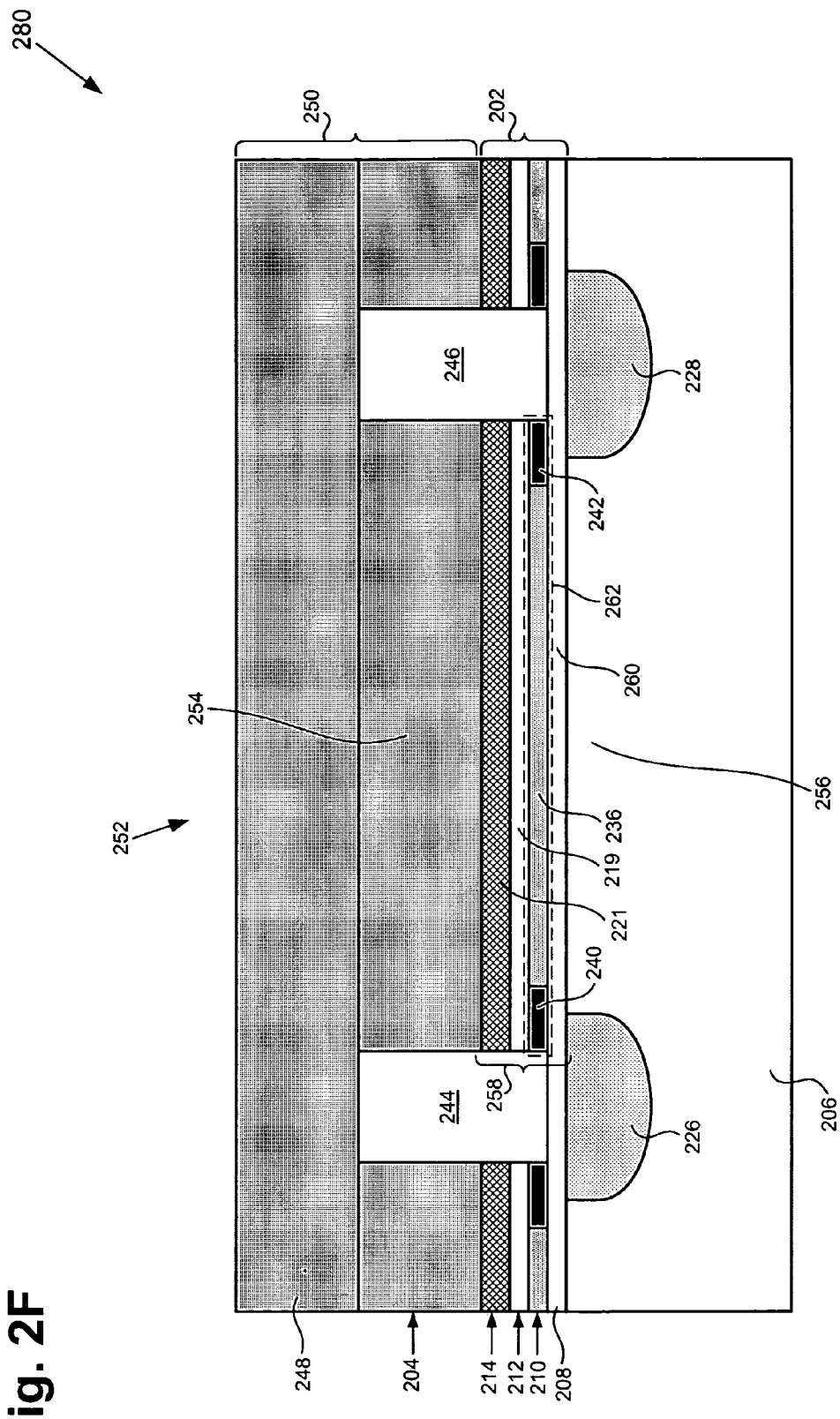
FIG. 2F illustrates a cross-sectional view, which includes a portion of a wafer processed according to an embodiment of the invention, corresponding to a final step in the flowchart in FIG. 1.

Referring to step 180 in FIG. 1 and structure 280 in FIG. 2F, at step 180 of flowchart 100, dielectric segments 244 and 246 are formed in respective trenches 216 and 218 and upper polysilicon layer 248 is formed over lower polysilicon layer 204 to form wordline 250 and complete formation of two-bit memory cell 252. Dielectric segments 244 and 246 are situated in respective trenches 216 and 218 and can comprise silicon oxide or other suitable dielectric material. Dielectric segments 244 and 246 can be formed by using a CVD process or other suitable processes to conformally deposit a layer of silicon oxide over trenches 216 and 218 and lower polysilicon layer 204. The layer of silicon oxide can then be planarized by using a chemical mechanical process (CMP) or other suitable planarizing process to remove an appropriate amount of silicon oxide such that silicon oxide remains only in trenches 216 and 218.

Upper polysilicon layer 248 is situated over lower polysilicon layer 204 and dielectric segments 244 and 246 and can comprise polycrystalline silicon (polysilicon). Upper polysilicon layer 248 can be formed by depositing a layer of polysilicon over lower polysilicon layer 204 and dielectric segments 244 and 246 by using a CVD process or other suitable deposition processes. Wordline 250 is situated over dielectric stack 202 and includes lower polysilicon layer 204 and upper polysilicon layer 248. Two-bit memory cell 252, which can be a two-bit flash memory cell, is situated between bitlines 226 and 228 and includes control gate 254. Control gate 254 comprises a portion of wordline 250 situated between dielectric segments 244 and 246 and situated over channel region 256, which is situated in substrate 206 between bitlines 226 and 228. Two-bit memory cell 252 also includes gate stack 258, which comprises lower oxide segment 260, charge-trapping layer 262, upper oxide segment 219, and gate injection blocking segment 221. Charge-trapping layer 262 includes conductive segments 240 and 242, which are utilized as independent charge storage locations for respective data bits in two-bit memory cell 252, and nitride segment 236. Gate injection blocking segment 221 blocks back gate injection into nitride segment 236 during an erase process.

Since nitride segment 236 in charge-trapping layer 262 comprises silicon nitride ($Si_3N_4$), which is a dielectric material (i.e. an insulator), charge (i.e. electrons) stored in each conductive segment (i.e. conductive segment 240 and conductive segment 242) is prevented from significantly diffusing into nitride segment 236 and traveling between the conductive segments. Thus, nitride segment 236 enables a data bit to be independently stored in each of conductive segments 240 and 242 in two-bit memory cell 252 by electrically insulating conductive segment 240 from conductive segment 242. The result of step 180 of flowchart 100 is illustrated by structure 280 in FIG. 2F.

Thus, since electrons are stored in conductive segments (e.g., conductive segments 240 and 242), which comprise a conductive material such as silicon-rich nitride or polysilicon, in the present invention's two-bit memory cell, the mobility of the stored electrons is significantly increased compared to the mobility of electrons stored in a conventional silicon nitride layer in a conventional two-bit memory cell. As a result, the erase speed of the present invention's two-bit memory cell using a Fowler-Nordheim tunneling erase process is significantly increased compared to the erase speed of a conventional two-bit memory cell using a conventional silicon nitride layer for charge storage. For example, the present invention's two-bit memory cell can advantageously achieve a three to four order of magnitude increase in erase speed using the Fowler-Nordheim tunneling erase process compared to a conventional two-bit memory cell using a conventional silicon nitride charge storage layer.

From the above description of exemplary embodiments of the invention it is manifest that various techniques can be used for implementing the concepts of the present invention without departing from its scope. Moreover, while the invention has been described with specific reference to certain embodiments, a person of ordinary skill in the art would recognize that changes could be made in form and detail without departing from the spirit and the scope of the invention. The described exemplary embodiments are to be considered in all respects as illustrative and not restrictive. It should also be understood that the invention is not limited to the particular exemplary embodiments described herein, but is capable of many rearrangements, modifications, and substitutions without departing from the scope of the invention.

Thus, a two-bit memory cell having conductive charge storage segments and method for fabricating same have been described.

The invention claimed is:

1. A two-bit memory cell situated over a substrate, said two-bit memory cell comprising:
    a gate stack situated over said substrate, said gate stack comprising a charge-trapping layer;
    said charge-trapping layer comprising first and second conductive segments and a nitride segment, said nitride segment being situated between said first and second conductive segments, said first and second conductive segments and said nitride segment being in horizontal alignment in said charge-trapping layer;
    wherein said first and second conductive segments provide respective first and second data bit storage locations in said two-bit memory cell.

2. The two-bit memory cell of claim 1 wherein said nitride segment electrically insulates said first conductive segment from said second conductive segment.

3. The two-bit memory cell of claim 1 wherein said first and second conductive segments comprise silicon-rich nitride.

4. The two-bit memory cell of claim 1 wherein said first and second conductive segments comprise polycrystalline silicon.

5. The two-bit memory cell of claim 1 wherein said gate stack further comprises a lower oxide segment, wherein said lower oxide segment is situated between said substrate and said charge-trapping layer.

6. The two-bit memory cell of claim 5 wherein said gate stack further comprises all upper oxide segment, wherein said upper oxide segment is situated over said charge-trapping layer.

7. The two-bit memory cell of claim 6 wherein said gate stack further comprises a gate injection blocking segment, wherein said gate injection blocking segment is situated over said upper oxide segment, wherein said gate injection blocking segment comprises a high-k dielectric material.

8. The two-bit memory cell of claim 1 further comprising a control gate, wherein said control gate is situated over said gate stack, wherein said control gate comprises polycrystalline silicon.

9. The two-bit memory cell of claim 1 wherein said gate stack is situated between a first dielectric segment and a second dielectric segment, wherein said first dielectric segment is situated over a first bitline and said second dielectric segment is situated over a second bitline.

10. The two-bit memory cell of claim 1 wherein said two-bit memory cell is a two-bit flash memory cell.

\* \* \* \* \*